Figure 1:
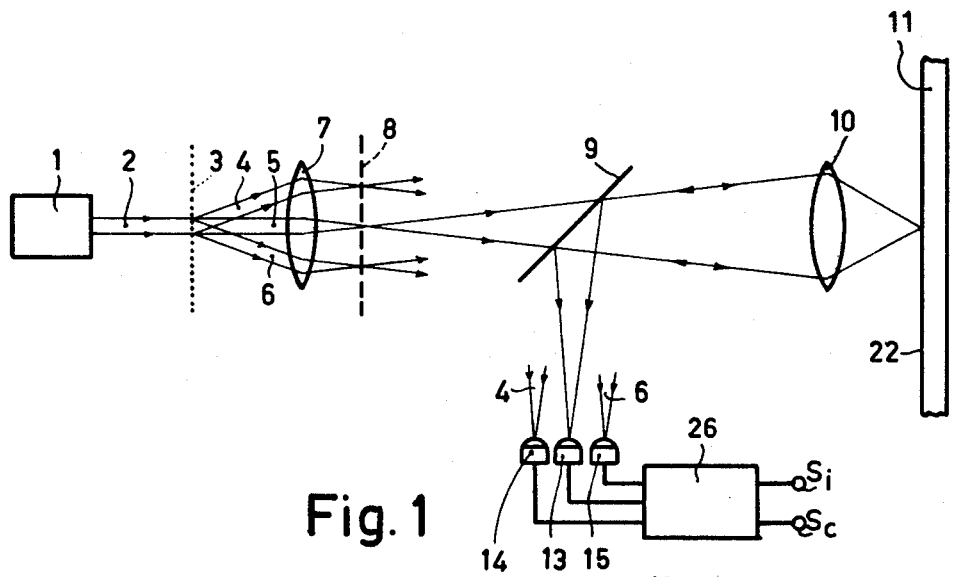

United States Patent [19]
Velzel et al.

[11] 3,992,575
[45] Nov. 16, 1976

[54] APPARATUS FOR OPTICALLY READING A RECORD CARRIER BY MEANS OF AN AUTOFOCUS DEVICE

[75] Inventors: Christiaan Hendrik Frans Velzel; Peter Ferdinand Greve, both of Eindhoven, Netherlands

[73] Assignee: U.S. Philips Corporation, New York, N.Y.

[22] Filed: Nov. 26, 1974

[21] Appl. No.: 527,244

[30] Foreign Application Priority Data
Feb. 25, 1974 Netherlands ................. 7402504

[52] U.S. Cl. .................. 178/6.6 R; 178/6.7 A; 179/100.3 V; 250/201
[51] Int. Cl.$^2$ .................. H04N 5/76; G11B 7/12
[58] Field of Search ....... 178/6.7 A, 6.7 R, DIG. 29, 178/6.6 R, 6.6 DD; 179/100.3 V; 250/201; 356/113

[56] References Cited
UNITED STATES PATENTS

| | | | |
|---|---|---|---|
| 3,495,893 | 2/1970 | Geusic | 356/113 |
| 3,622,797 | 11/1971 | Bragg | 250/234 |
| 3,833,769 | 9/1974 | Compaan | 179/100.3 V |
| 3,876,841 | 4/1975 | Kramer | 178/6.7 A |
| 3,876,842 | 4/1975 | Bouwhuis | 179/100.3 V |

*Primary Examiner*—Bernard Konick
*Assistant Examiner*—Alan Faber
*Attorney, Agent, or Firm*—Frank R. Trifari; Simon L. Cohen

[57] ABSTRACT

An apparatus is described for reading a record carrier on which information is stored in an optically readable reflecting structure. By projecting two radiation spots one before and one behind the plane of the information structure, it is possible to ascertain whether a read beam is properly focussed on the information structure.

5 Claims, 4 Drawing Figures

APPARATUS FOR OPTICALLY READING A RECORD CARRIER BY MEANS OF AN AUTOFOCUS DEVICE

The invention relates to an apparatus for reading a record carrier, on which information is stored in an optically readable structure. The apparatus includes a radiation source, an objective system for imaging the radiation source onto the information structure of the record carrier, a radiation-sensitive detection system for converting the radiation which is supplied by the radiation source and modulated by the information structure into an electrical signal. In order to determine a possible deviation between the desired and the actual position of the plane of the information structure, the radiation source consists of at least two radiation sub-sources which are offset relative to each other both in the direction of the optical axis of the objective system and in a direction transverse thereto, a separate detector being provided in the detection system for each of the radiation sub-sources. In a known apparatus, apart from a read spot which serves for reading the high-frequency information on the record carrier, two auxiliary radiation spots are projected onto the information structure. Each of the sub-beams, with which the auxiliary radiation spots are formed, is focussed in a different plane. The planes are situated at either side of the plane in which the read spot is focussed. The mutual distances between the different planes are constant.

The read beam which is modulated by the information structure and the sub-beams are led to separate detectors in the radiation-sensitive detection system. The modulation depths of the electrical signals supplied by the detectors depend on the degree of focussing of the corresponding beams on the information structure. By comparison of the signals supplied by the auxiliary detectors associated with the auxiliary radiation spots, it is possible to ascertain whether the read beam is focussed on the information structure and in which direction a deviation, if any, occurs.

In the known apparatus the read beam and the sub-beams were derived from a main beam, supplied by the radiation source, with the aid of a Fresnel zone plate. The present invention provides an apparatus in which the various beams are formed in a different manner. According to a general feature of the apparatus according to the invention the radiation path between the radiation source and the objective system successively includes: a first element, which divides a radiation beam supplied by the radiation source into separate sub-beams, and a second element for focussing the sub-beams in different planes.

A first embodiment of an apparatus according to the invention is further characterized in that the first element is a diffraction grating and that the second element is a radiation-transmitting plate, disposed in the object plane of the objective system, which plate has a number of different thicknesses which correspond to the number of sub-beams.

According to a feature of a second embodiment of an apparatus according to the invention, the first element consists of a Wollaston prism and the second element is a lens of a doubly-refracting material.

The invention will now be described with reference to the drawing, in which

Figure 2:
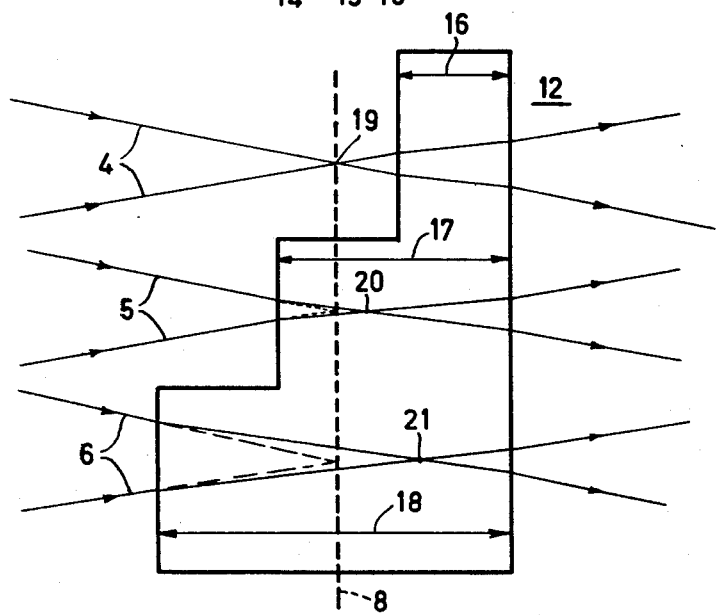
Figure 3:
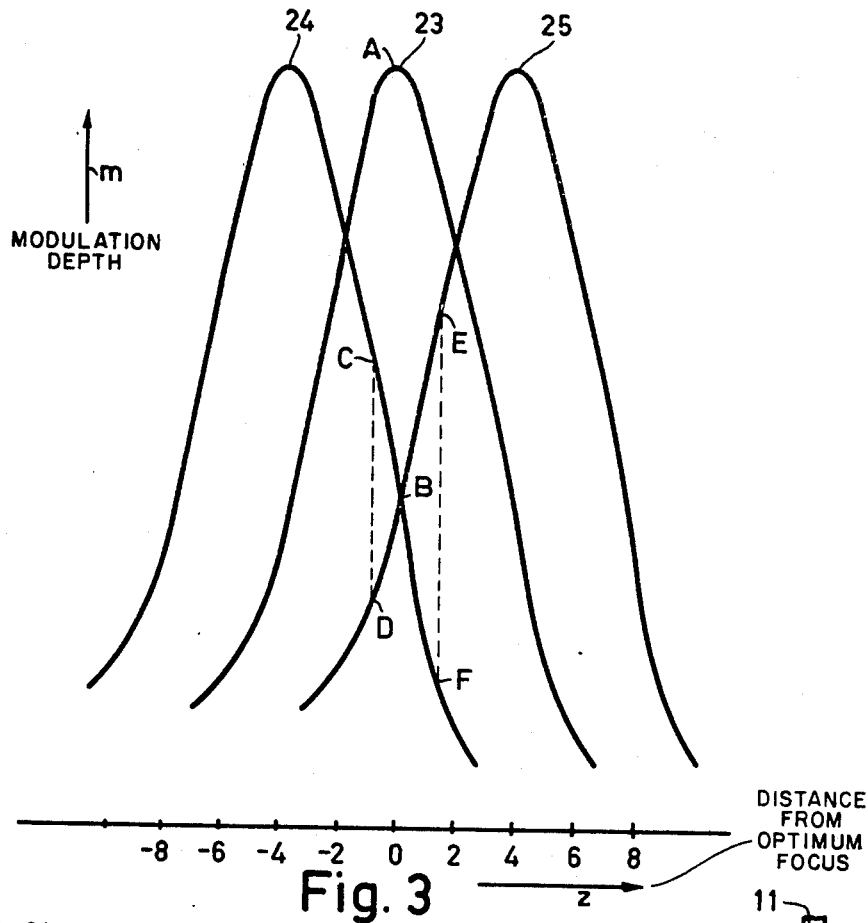
Figure 4:
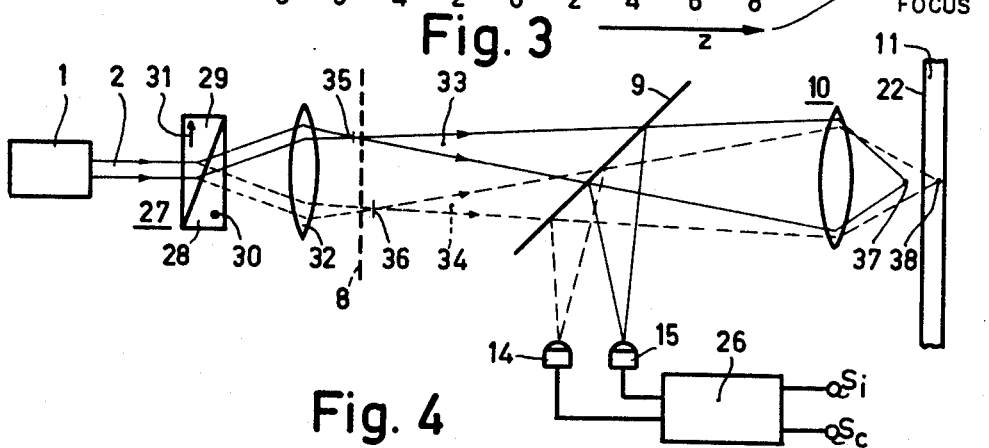

FIG. 1 schematically shows a first embodiment of an apparatus according to the invention, FIG. 2 shows an element of said apparatus, FIG. 3 shows the variation of the modulation of the signals, supplied by the detectors in the apparatus of FIG. 1, as a function of the focussing, FIG. 4 schematically shows a second embodiment of an apparatus according to the invention, In FIG. 1 the reference numeral 1 represents a radiation source, for example a laser source, which supplies a narrow beam of radiation 2. The beam is incident on a diffraction grating 3, so that two first-order beams 4 and 6 and one zero-order beam 5 are obtained. The subeams 4, 5 and 6 are focussed in a plane 8 by an auxiliary lens 7. The plane is the object plane of an objective system 10, which focusses the read beam 5 on the information structure to be read. By way of example, it is assumed that the plane 22 of the information structure is located at the front side of the record carrier 11. Furthermore, it is assumed by way of example that the information structure is reflecting, so that the modulated read beam returns substantially along itself. For example, the modulated read beam is reflected to a radiation-sensitive detector 13 using a semitransparent mirror 9. The stored information may be recovered from the electrical output signal of the detector 13 in the electronic circuit 26, in a known manner (signal Si).

In the plane 8, according to the invention, a radiation-transmitting element, for example a glass or a plastic plate 12 is disposed, of which a cross-section is shown in FIG. 2. The plate is stepped and has three different thicknesses 16, 17 and 18, the differences in thickness 18-17 and 17-16 being equal. Owing to the presence of the plate 12 in the apparatus of FIG. 1, the beams 4, 5 and 6 must traverse different optical path-lengths. The foci 19, 20 and 21 of the beams are then no longer disposed in the plane 8, but are axially shifted. The focus 20 is imaged in the plane 22 by the objective 10, while the foci 19 and 21 are imaged in front of and behind the plane 22 respectively.

The sub-beams 4 and 6 are guided to their associated detectors 14 and 15 in a similar way as the read beam 5. The output signals of said detectors are also modulated in accordance with the information stored on the record carrier. In the position of the plane 22 relative to the objective shown in FIG. 1, the beam 5 forms a read spot on the information structure whose size is of the order of magnitude of the smallest optical detail in the information structure. The modulation depth of the signal supplied by the detector 13 is then maximum. The sub-beams 4 and 6 are not sharply focussed on the information structure, so that the radiation spots formed on the information structure by these beams are larger than the read spot. The modulation depths of the signals supplied by the detectors 14 and 15 are consequently smaller than that of the signal supplied by the detector 13.

FIG. 3 shows the variation of the modulation depth $m$ as a function of the defocussing z. The curves 23, 24 and 25 correspond to the detectors 13, 14 and 15 respectively. If the read beam 5 is focussed on the information structure, i.e. if $z = 0$, the curve 23 attains its maximum A. The curves 24 and 25 both pass through point B: the modulation depths of the signals supplied by the detectors 14 and 15 are equal. If the plane 22 is located to the left of the desired position, i.e. z is smaller than zero, the modulation depth C of the signal from the detector 14 is greater than the modulation depth D of the signal from the detector 15. If the plane 22 is located to the right of the desired position, i.e. $z$ is greater than zero, the situation is reversed, compare points E and F in FIG. 3. From the difference in modulation depth of the signals supplied by the detectors 14 and 15 it is possible to derive a substantially linear control signal $S_c$ in an electronic circuit 26 which is connected to the detectors. By means of said control signal the focussing of the objective 10 can be corrected as regards direction and magnitude, in known manner.

In an embodiment of an apparatus according to FIG. 1, the objective had a numerical aperture of 0.4. The foci of the sub-beams 4 and 6 were located 4 $\mu$m before and behind the focus of the read beam. At a spatial frequency of 400/mm of the optical details of the information structure focussing errors between + 12 $\mu$/um and − 12 $\mu$m could be detected satisfactorily. The linear region ranged between + 2 $\mu$um and −2 $\mu$um.

It is to be noted that when using the described method of reading a record carrier, in which the spatial frequency of the optical details which represent the information varies over the record carrier, the magnitude of the signal for focussing correction changes with the location of the record carrier. This occurs for example in the case of a round disc-shaped record carrier on which a television program is stored in a multiplicity of concentric or quasi-concentric tracks, each track containing a TV frame. The average spatial frequency of the optical details is a function of the radius of the relevant track. When reading such a record carrier, even when the focussing remains the same, the modulation depths of the electrical signals supplied by the detectors will change. According to the invention, use can be made of the so-called line synchronizing pulses in the television signal for determining the deviations between the actual and the desired position of the plane of the information structure. These pulses for example have a frequency of 4 MHz, which corresponds to a spatial frequency on the record carrier varying between for example 180 and 360 periods per mm for track radii between for example 17 and 14 cm. In this range of spatial frequencies the variation in modulation depth is relatively small, for example 15%, so that in said range the influence of the variation of the spatial frequencies on the signal for focussing correction is small.

FIG. 4 shows a second embodiment of an apparatus according to the invention. In said apparatus a Wollaston prism 27 is disposed behind the radiation source 1. This prism consists of two identically equal component prisms 28 and 29 of uniaxial doubly refracting crystals. The optic axis 31 of the component prism 29 is parallel to the plane of drawing and the optic axis 30 of the component prism 28 is perpendicular to the plane of drawing. The radiation beam 2 which is incident on one of the parallel major faces of the Wollaston prism 27 is split into two sub-beams 33 and 34 in the prism, which are polarized mutually perpendicularly and which make a small angle with each other. The sub-beams traverse a lens 32 of a doubly-refracting material. The axis of the lens 32 is diagonal relative to the directions of polarization of the sub-beams. As a result, said lens has different powers for different directions of polarization, so that the sub-beams 33 and 34 are focussed in planes which are located at different distances from the lens 32. The foci 35 and 36 are imaged in different planes near the plane 22 of the information structure by the objective 10. Instead of a lens of a doubly-refracting material it is also possible to use a normal lens, a glass plate 12 then again being disposed in the plane 8. The Wollaston prism may be replaced by a Savart plate.

If the plane 22 is in the contact position, as is shown in FIG. 4, the image 37 of the focus 35 is located before and the image 38 of the focus 36 behind the plane 22. The sub-beams 33 and 34 are reflected and modulated by the information structure and are directed to the detectors 14 and 15 by, for example, a semi-transparent mirror 9.

In this case no separate read beam is employed; the high-frequency information is derived from the signals supplied by the detectors 14 and 15 associated with the auxiliary radiation spots. In an electronic circuit 26 which is connected to said detectors, a high frequency component $S_i$, for recovering the information stored on the record carrier, and a component $S_c$ which provides an indication of the focussing, can be extracted.

For a correct reading it is necessary that the signals from the detectors 14 and 15 have sufficient modulation depth. The distances between the foci of the radiation beams 33 and 34 and the plane 22 of the information structure should not become too large. The range in which focussing errors can be detected is therefore smaller for the apparatus of FIG. 4 than for the apparatus of FIG. 1.

Also for an apparatus in accordance with FIG. 1 the range in which the deviations between the actual and the desired position of the plane of the information structure can be detected is limited. By a suitable choice of the size of the detectors, however, said range may be extended. A low-frequency component of the detectors signals is then measured. Said component exhibits a substantial variation for such deviation between the actual and the desired position of the plane of the information structure that the diameter of the sub-beams at the location of the detectors is smaller than the radiation-sensitive area of said detectors. In the electronic circuit 26 the low-frequency components of the detector signals produced by the sub-beams, may be compared and processed to a control signal for focussing correction. Thus, deviations between the actual and desired position of the plane of the information structure up to for example + 30 um can be determined.

With this last method the individual details of an information track are no longer observed, but averaging over a certain track of length is applied. For this, use is made of the fact that on an average a track has a different influence on a radiation beam than the area between the tracks. This method may therefore be used for detecting deviations between the actual and desired position of a record carrier with blank tracks. A blank track is to be understood to mean a track which contains no information details, but which can be optically distinguished from the areas surrounding it. The method may for example be used for writing on an informationless record carrier body which is provided with follow-on tracks for positioning the write spot of radiation onto said record carrier body.

For determining deviations of the position of the information plane said apparatus either employs the information structure in the tracks or the track structure. The apparatus is not only suited for reading a radiation-reflecting record carrier, as is represented in FIGS. 1 and 4, but also for reading a record carrier which is radiation-transmitting.

What is claimed is:

1. Apparatus for reading a record carrier on which information is stored in an optically readable structure, comprising a radiation source providing a radiation beam, first element means for dividing said radiation beam into at least two sub-beams, second element means for focussing said sub-beams in different spatially separated planes located on either side of said optically readable structure, said optically readable structure thereby interacting with the sub-beams and providing modulated sub-beams, and a separate radiation sensitive detector in the path of each modulated sub-beam for developing a focus correction signal.

2. An apparatus as claimed in claim 1, wherein the first element means is a diffraction grating and that the second element means is a radiation-transmitting plate which is disposed in the object plane of the objective system, which plate has a number of different thicknesses corresponding to the number of sub-beams.

3. An apparatus as claimed in claim 1, wherein the first element is a Wollaston prism and the second element a lens of a doubly-refracting material.

4. An apparatus as claimed in claim 2, wherein in an electronic circuit which is connected to the detectors a signal for focussing correction is derived from the high-frequency components of the detector signals.

5. An apparatus as claimed in claim 21, wherein in an electronic circuit which is connected to the detectors a signal for focussing correction is derived from the low-frequency components of the detector signals.

* * * * *

UNITED STATES PATENT AND TRADEMARK OFFICE
CERTIFICATE OF CORRECTION

PATENT NO. : 3,992,575
DATED : November 16, 1976
INVENTOR(S) : CHRISTIAAN HENDRIK FRANS VELZEL and PETER FERDINAND GREVE It is certified that error appears in the above-identified patent and that said Letters Patent are hereby corrected as shown below:

Col. 1, line 22, "In a" should start a new paragraph;

Col. 3, line 13, "μum" should be --μm--;

line 15, "of" third occurence should be --in--;

line 17, "μ/um" should be --μm--; "μum" should be --μm--;

line 18, "μum" should be --μm--;

line 19, "μum" should be --μm--;

Col. 4, line 47, "+ 30 um" should be --± 30 μm--;

Claim 4, line 1, "2" should be --1--;

Claim 5, line 1, "21" should be --1--;

Signed and Sealed this

Fifteenth Day of February 1977

[SEAL]

Attest:

RUTH C. MASON
*Attesting Officer*

C. MARSHALL DANN
*Commissioner of Patents and Trademarks*